United States Patent [19]

Watanabe et al.

[11] Patent Number: 4,531,202
[45] Date of Patent: Jul. 23, 1985

[54] SEMICONDUCTOR NONVOLATILE READ ONLY MEMORY DEVICE

[75] Inventors: Shigeyoshi Watanabe; Sumio Tanaka, both of Tokyo, Japan

[73] Assignee: Tokyo Shibaura Denki Kabushiki Kaisha, Japan

[21] Appl. No.: 344,049

[22] Filed: Jan. 29, 1982

[30] Foreign Application Priority Data

Feb. 5, 1981 [JP]  Japan .................................. 56-14985

[51] Int. Cl.³ ............................................ G11C 11/40
[52] U.S. Cl. ..................................... 365/104; 365/226
[58] Field of Search ................ 365/104, 189, 210, 226

[56] References Cited

U.S. PATENT DOCUMENTS 4,400,801  8/1983  Kible ................................... 365/195

FOREIGN PATENT DOCUMENTS 1502270  3/1978  United Kingdom ................ 365/174
2040631  8/1980  United Kingdom ................ 365/174

Primary Examiner—Terrell W. Fears
Attorney, Agent, or Firm—Finnegan, Henderson, Farabow, Garrett & Dunner

[57] ABSTRACT

A semiconductor nonvolatile read only memory device has a voltage applying circuit which sets all word lines at ground potential in a stand-by mode and sets only a selected word line at a high level in an active mode. The word lines are connected to the gates of semiconductor nonvolatile memory transistors. Each of the memory transistors has the source (or drain) grounded and the drain (or source) connected to output lines. In a stand-by mode, the voltage applying circuit keeps all the word lines at ground potential. In an active mode, the voltage applying circuit applies a high level voltage only to the selected word line. The memory transistor connected to the selected word line produces data of "0" or "1" to the output line.

8 Claims, 10 Drawing Figures

SEMICONDUCTOR NONVOLATILE READ ONLY MEMORY DEVICE

BACKGROUND OF THE INVENTION

The present invention relates to a semiconductor nonvolatile read only memory device and, more particularly, to a semiconductor nonvolatile read only memory device with a high-speed access time.

At present, semiconductor nonvolatile read only memory devices (to be referred to as ROMs hereinafter) have frequently been used for storing computer programs and fixed data. The ROM is usually comprised of memory cell transistors, X and Y addresses, decoders, an output buffer, and the like. Referring to FIG. 1, the construction and operation of a conventional ROM of the direct decoding system constituted of four X address buffers, will now be described. Assume that the transistors shown in FIG. 1 are all n-channel MOS transistors.

An address buffer 10 is controlled by chip enable signals CE* and $\overline{CE^*}$ (the inverted signal of signal CE*). Address buffer 10, in a stand-by mode, produces address signals A1* and $\overline{A1^*}$ of low level and, in an active mode, wave-shapes an address signal A1 to produce address signal A1* and $\overline{A1^*}$ of low or high level. Three other address buffers (not shown) have each substantially the same construction. A row decoder 12 is comprised of enhancement type (to be referred to as E-type hereinafter) MOSFETs 14, 16, 18 and 20, and depletion-type (to be referred to as D-type hereinafter) MOSFETs 22, 24 and 26. D-type MOSFET 22 which is supplied at the drain node 28 with a power source voltage Vcc has its gate and source connected to a decode node 30, to which power source voltage Vcc is applied when row decoder 12 is selected. In a writing operation, D-type MOSFET 24 is applied at a gate node 32 with a low level signal to disconnect node 30 from a word line node 34, while in a reading operation, is applied at gate node 32 with a high level signal to connect nodes 30 and 34. D-type MOSFET 26 has the drain connected to a write terminal 36 to charge, in a writing operation, word line node 34 up to a write potential Vpp when node 34 is selected. Address signals from the address buffers are inputted to the gates of MOSFETs 14, 16, 18 and 20 as follows: an address signal A1* is applied to the gate of MOSFET 14; an address signal A2* to the gate of MOSFET 16; an address signal $\overline{A3^*}$ to the gate of MOSFET 18; and address signal A4* to the gate of MOSFET 20. Since, in a stand-by mode, low-level address signals are applied to the gates of MOSFETs 14 to 20, these FETs are turned OFF, allowing node 30 to become at high level. In an active mode, decode node 30 becomes at high level when the row decoder is selected, and becomes at low level when the decoder is not selected. The sources of MOSFETs 14 to 20 are grounded. Word line node 34 is connected to the gate of memory cell transistor 38, which, in a writing operation, is applied with a high voltage to perform data write. Memory cell transistor 38 has the source connected to ground and the drain to a read common node 40. Read common node 40 is connected to a sense amplifier (not shown) and, in a stand-by mode, is disconnected from the amplifier, thereby causing the potential at node 40 to become in a floating state.

Referring to FIGS. 2(A) to 2(D), the operation of the ROM thus constructed will now be described. Assume that data has already been written into memory cell transistor 38. Since read common node 40 is so provided to be in a floating state in a stand-by mode, the leak of charge from memory cell transistor 38 causes the potential at read common node 40 to drop to the ground potential. Under the condition that read common node 40 is at zero level, the mode of the chip enable signal $\overline{CE}$ applied to a chip enable buffer (not shown) is changed from a stand-by state to an active state, as shown in FIG. 2(A). A word line node other than word line node 34 is then selected. As a result, the potential at word line node 34 changes from a high level to a low level, as shown in FIG. 2(B). This potential change causes a potential at common node 40 to decrease from zero to minus value as indicated by RA in FIG. 2(C), because of the coupling by the capacitance present between nodes 34 and 40 (more specifically, the capacitance between all the other word lines than the selected word line and the read common node). For this reason, when a data of "0" is written into the memory cell transistor selected, the potential at common node 40 rises as indicated by RB in FIG. 2(C). When a data of "1" is written into the memory cell transistor, the potential at common node 40 rises as indicated by RC in FIG. 2(C). Since the potential at common node 40 has fallen to the minus region, a potential rising rate of "0" data is different from that of "1" data. Consequently, a data output signal from a data output buffer (not shown) connected to the sense amplifier amplifying a sensed signal from the common node changes along a curve DB in reading "0" as shown in FIG. 2(D), and changes along a curve DC in reading "1". As described above, the ROM shown in FIG. 1 has a drawback that the access time depends on data stored in the memory cell transistor, more particularly, the access time for "0" data is rather long.

To solve this problem, the ROM arranged as shown in FIG. 3 has been proposed. FIG. 3 shows an arrangement of a major portion of the ROM.

Referring to FIGS. 4(A) to 4(E), the operation of the ROM thus constructed will now be described. In a stand-by mode, low level signals, for example, A1*, A2*, $\overline{A1^*}$ and $\overline{A2^*}$, are applied from address buffers to the gates of E-type MOSFETs 42 to 48, which are turned OFF, causing a node 50 to become at high level. As a result, a D-type MOSFET 52, having the gate and source connected to node 50, is turned ON, and drain node 54 to which voltage Vcc is applied supplies voltage Vcc to node 50. The high level signal at node 50 is delayed by a delay circuit 60 constituted of a resistor 56 and a capacitor 58 and is applied to the gate of an E-type MOSFET 62, which is then turned ON. The drain of E-type MOSFET 62 is connected to a read common node 64. Read common node 64 is connected to a sense amplifier (not shown) which amplifies the sensed signal produced from node 64.

A chip enable signal $\overline{CE}$ of low level is inputted to a chip enable buffer (not shown) (FIG. 4(A)) and the ROM is brought to an active mode. In an active mode, any one of E-type MOSFETs 42 to 48 is turned ON, causing node 50 to drop to a low level potential (FIG. 4(B)). This potential change is delayed for a period of time D by delay circuit 60 as shown in FIG. 4(C) and then is applied to the gate of E-type MOSFET 62. Although the potential at a selected read common node once falls to a minus value as shown in FIG. 4(D), it is restored to the zero potential, as represented by RE in FIG. 4(D), by supplying charge from the ground because E-type MOSFET 62 remains ON for the delay time D of delay circuit 60. This potential restoration makes it possible to compensate the difference between the access time when the memory cell transistors store "0" data and that when they store "1" data. As a result, the signal produced from a data output buffer (not shown) connected to the sense amplifier has similar access times for "0" read (curve DB) and "1" read (curve DC) as shown in FIG. 4(E). Although, having the advantage mentioned above, the ROM shown in FIG. 3 has a drawback that the delay time D of delay circuit 60, during which data access is impossible, elongates access time.

SUMMARY OF THE INVENTION

Accordingly, the object of the present invention is to provide a semiconductor nonvolatile read only memory device which has a shortened an access time.

The object has been achieved by the semiconductor nonvolatile read only memory device which comprises: semiconductor nonvolatile memory transistors, a reference voltage being applied to the sources (or drains) of said transistors; word lines connected to the gates of said transistors; output lines connected to the drains (or sources) of said transistors; and reference voltage applying means connected to said word lines for applying, in a stand-by mode, said reference voltage to said word lines and, in an active mode, a high (or low) level voltage to only one of said word lines selected.

As described above, the present invention is so constructed that, in a stand-by mode, all the word lines are kept at the reference voltage (e.g. ground potential) and, in an active mode, the potential at only the selected word line is changed from the reference voltage to a high or low level voltage. Therefore, the influence by the capacitive coupling between the output lines and the unselected word lines is extremely reduced, unlike the conventional ROM, leading to a great reduction of the access time.

In an embodiment where the ground potential is used for the reference voltage and, in a stand-by mode, all the word lines are at the ground potential and, in an active mode, only one of the word lines selected are at high potential, there is no possibility that data is erroneously written into the nonvolatile memory cell transistor in a stand-by mode. Accordingly, the reliability of the ROM according to the present invention is improved. On the contrary, in the conventional ROM, since a high level voltage is applied to the word lines in a stand-by mode, there is a possibility of an erroneous data write.

BRIEF DESCRIPTION OF THE DRAWINGS

By way of example and to make the description clearer, reference is made to the accompanying drawings, in which.

DETAILED DESCRIPTION OF THE PREFERRED EMBODIMENTS

Figure 5:
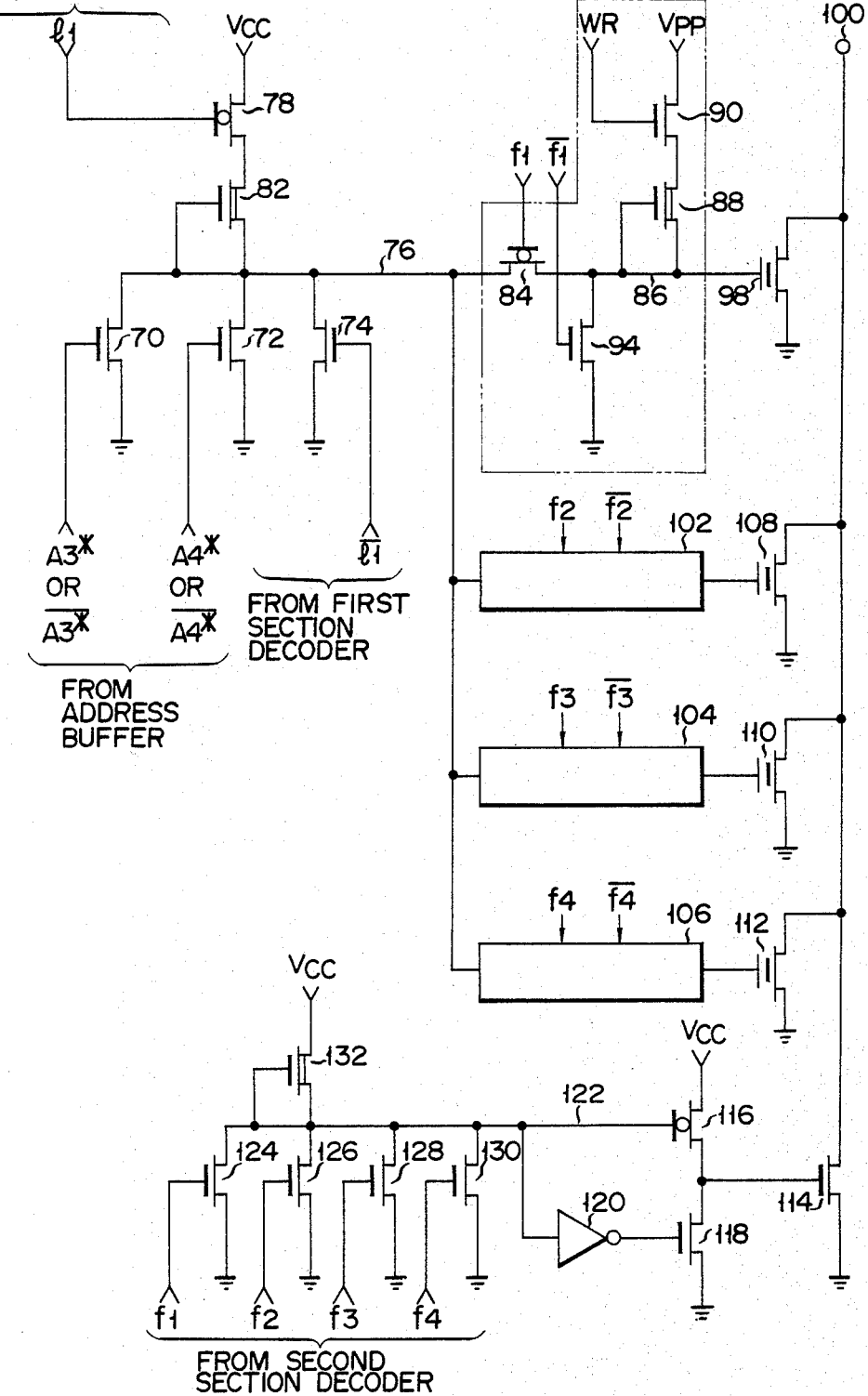
FIG. 5 shows a circuit diagram of a major portion of a first embodiment of a ROM using a partial decoding system according to the present invention.

FIG. 5 is a circuit diagram of a major portion of a semiconductor nonvolatile read only memory device which comprises a first embodiment of the present invention. This first embodiment is a ROM employing a partial decoding system. Assume that all MOSFETs shown in FIG. 5 are n-channel MOSFETs. FIG. 5 illustrates only a circuit related to one row decoder. E-type MOSFETs 70, 72, 74, 78 and 82 constitute a row decoder. MOSFETs 70 to 74 have their sources grounded and their drains connected to a decode node 76. The gates of MOSFETs 70 and 72 are supplied with address signals A3* or $\overline{A3}$* and A4* or $\overline{A4}$*. These signals, when decode node 76 is selected, turn off FETs 70 and 72, bringing node 76 to a high level potential. A signal $\overline{l1}$ is inputted from a first pre-decoder (not shown) to the gate of MOSFET 74. Another signal l1 produced from the first pre-decoder is inputted to the gate of an intrinsic-type (to be referred to an I-type) MOSFET 78. The pre-decoder is controlled by chip enable signals CE and $\overline{CE}$ and produces a low level signal l1 and a high level signal $\overline{l1}$ in a stand-by mode of this embodiment. The first pre-decoder is supplied with address signals A1*, $\overline{A1}$*, A2* and $\overline{A2}$* from an address buffer (not shown) and outputs signals l2, $\overline{l2}$, l3, $\overline{l3}$, l4 and $\overline{l4}$ as well as signals l1 and $\overline{l1}$ by decoding the address signals.

These signals l2 to $\overline{l4}$ are supplied to other row decoders each with the same construction as that of the row decoder shown in FIG. 5. A power source voltage Vcc is applied to the drain of I-type MOSFET 78. The source of MOSFET 78 is connected to the drain of a D-type MOSFET 82. D-type MOSFET 82 has the gate and source connected to a decode node 76, and, accordingly, operates to supply power source voltage Vcc to decode node 76 when the potential at decode node 76 is at high level and I-type MOSFET 78 is ON.

An I-type MOSFET 84 has the source connected to decode node 76 and the drain to a word line node 86, and electrically connects nodes 76 and 86 when, in an active mode, word line node 86 is selected and a high level signal f1 is applied to the gate thereof. The signal f1 is applied from a second pre-decoder to be described later. A D-type MOSFET 88 has the gate and source connected to word line node 86 and, in a writing operation, charges word line node 86 up to a write voltage Vpp. The drain of D-type MOSFET 88 is connected to the source of an E-type MOSFET 90, of which the drain is applied with write voltage Vpp. The gate of E-type MOSFET 90 is applied with a signal WR which is low in a reading operation (including a stand-by mode) and is brought to higher voltage more than Vpp to cause MOSFET 90 to perform a triode function in writing operation. Applying a low level signal WR allows D-type MOSFET 88 to be off in a stand-by mode, thereby minimizing current following through MOSFET 90. Further connected to word line node 86 is an E-type MOSFET 94. E-type MOSFET 94 has the source connected to ground and the gate supplied with a signal f̄1 from the second pre-decoder. Since signal f1 goes to high level in a stand-by mode, E-type MOSFET 94 is turned ON and then word line node 86 becomes at zero potential. I-type MOSFET 84, D-type MOSFET 88 and E-type MOSFETs 90 and 94 constitute a word line circuit 96.

A nonvolatile memory cell transistor 98 has the gate connected to word line node 86, the source to ground and the drain to a read common node 100. The data stored in transistor 98 is sensed and amplified by a sense amplifier (not shown) connected to read common node 100, and is outputted as a "1" or "0" signal from a data output buffer (not shown) connected to the sense amplifier.

Further connected to decode node 76 are word line circuits 102, 104 and 106. The arrangement of each of word line circuits 102 to 106 is the same as that of word line circuit 96. The second pre-decoder supplies signals f2, f3, f4, $\overline{f2}$, $\overline{f3}$ and $\overline{f4}$ to word line circuits 102 to 106. The word line nodes of word line circuits 102 to 106 are respectively connected to the gates of memory cell transistors 108 to 112. Memory cell transistors 108 to 112 have their sources grounded and their drains connected to read common node 100. Memory cell transistors 108 to 112 each operate like memory cell transistor 98.

Further connected to common node 100 is the drain of an E-type MOSFET 114 of which the source is grounded. The gate of E-type MOSFET 114 is connected to the source of an I-type MOSFET 116 of which the drain is supplied with power source voltage Vcc. The source of I-type MOSFET 116 is connected to an E-type MOSFET 118 of which the source is grounded. The gate of E-type MOSFET 118 is connected to a decode node 122 via an inverter 120. I-type MOSFET 116 has the gate connected to the decode node 122 so that MOSFET 116 is turned ON when a high level voltage is applied to the node 122 and MOSFET 118 is turned ON when a low-level voltage is applied to the same node. The drains of the E-type MOFFETs 124, 126, 128 and 130 whose sources are grounded are connected to decode node 122. The second pre-decoder transfers signals f1 to f4 and connected to the gates of E-type MOSFETs 124 to 130. Since, in a stand-by mode, signals f1 to f4 are all in a low level potential, E-type MOSFETs 124 to 130 are turned OFF, allowing a D-type MOSFET 132 to turn ON which has the gate and source connected to decode node 122 and the drain applied with power source voltage Vcc, thereby permitting decode node 122 to be applied with power source voltage Vcc. As a consequence, a high level voltage is applied to the gate of I-type MOSFET 116, causing MOSFET 116 to be turned ON, thereby allowing power source voltage Vcc to be applied to the gate of E-type MOSFET 114. As a result, MOSFET 114 is turned ON, causing the potential at read common node 100 to drop to zero level.

Figure 6:
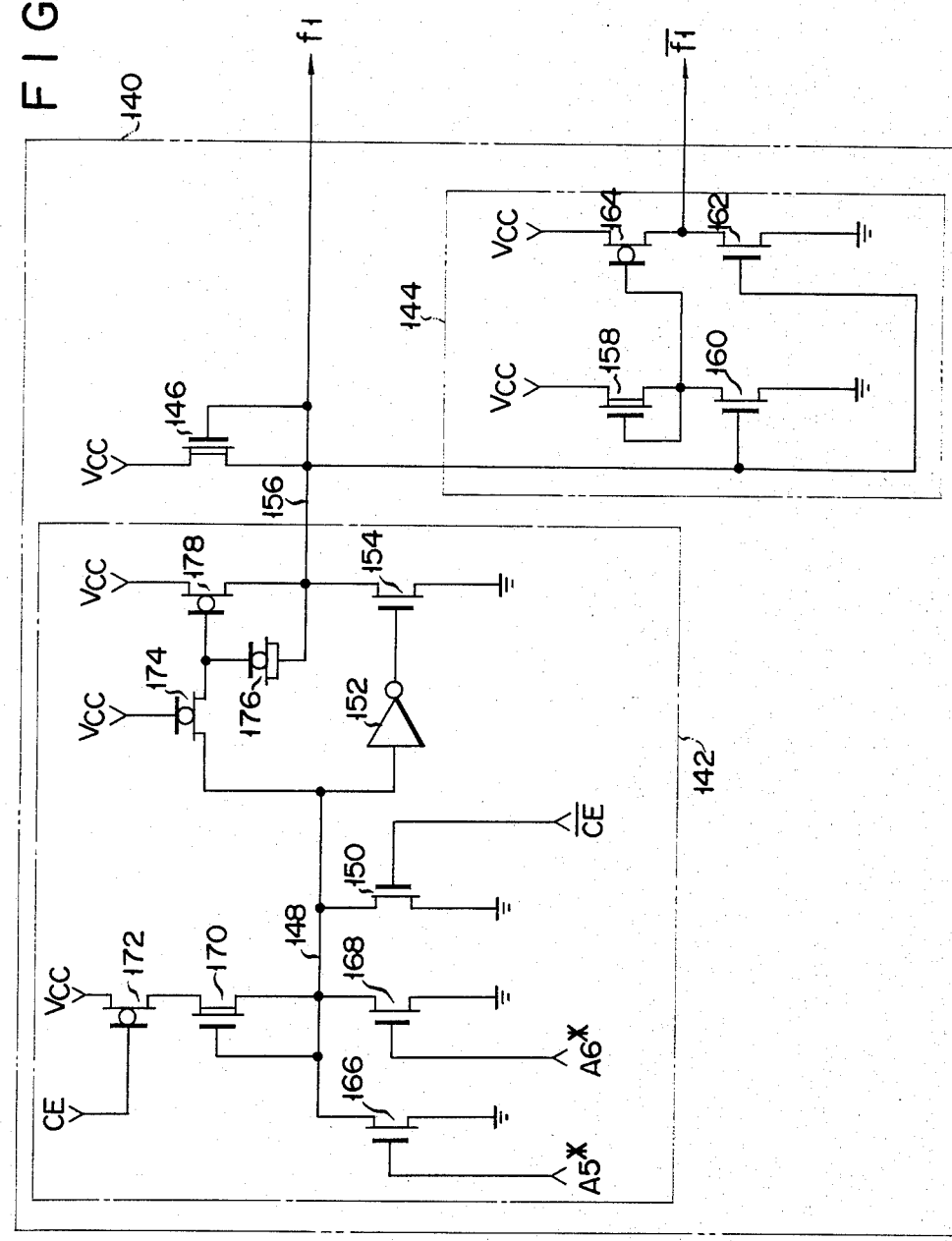
FIG. 6 is a circuit diagram for producing signals f1 and f̄1 in a ROM of the first embodiment shown in FIG. 5.

FIG. 6 shows a circuit 140 for obtaining signals f1 and $\overline{f1}$ of the second pre-decoder. The f1 and $\overline{f1}$ signal forming section 140 is comprised of a bootstrap pull-up inverter 142, a push-pull circuit 144 and a level-keeper transistor 146.

The operation of signal forming section 140 constructed as shown in FIG. 6 will now be described. Since, in a stand-by mode, a high level chip enable signal $\overline{CE}$ is applied to the gate of an E-type MOSFET 150 which has the drain connected to a decode node 148 and the source to ground, MOSFET 150 in turned ON and decode node 148 becomes at zero level. This low-level potential is inverted by an inverter 152 into a high level voltage, which is then applied to the gate of E-type MOSFET 154, causing MOSFET 154 to be turned ON, thereby bringing output node 156 to zero level. As a result, signal f1 of low level is produced at output node 156. The signal f1 is inverted into signal $\overline{f1}$ of high level by and outputted from push-pull circuit 144 comprised of a D-type MOSFET 158, an E-type MOSFETs 160 and 162 and an I-type MOSFET 164.

In an active mode, the gates of E-type MOSFETs 166 and 168 which have their sources connected to ground and their drains connected to decode node 148 are supplied with address signals A5* and A6* of high or low level, which have been wave-shaped by and supplied from the address buffer (not shown). When decode node 148 is selected, E-type MOSFETs 166 and 168 are turned OFF, bringing decode node 148 to high level, thereby causing a D-type transistor 170 to be turned ON of which the gate and source are connected to decode node 148. Then, a high level voltage is applied to decode node 148 from an I-type MOSFET 172 which has the source connected to the drain of D-type MOSFET 170 and the drain supplied with power source voltage Vcc. The high level voltage is inverted by inverter 152 into a low level voltage, which is then applied to the gate of MOSFET 154, thereby causing MOSFET 154 to be turned OFF. This high level voltage is applied to output node 156 via I-type MOSFETs 174, 176 and 178. As a result, signal f1 of high level is outputted from output node 156. The signal f1 of high level is inverted by push-pull circuit 144 to provide signal $\overline{f1}$ of low level.

The f2 and $\overline{f2}$, f3 and $\overline{f3}$, and f4 and $\overline{f4}$ signal forming sections (not shown) have also the same construction as that of f1 and $\overline{f1}$ signal forming section 140. Any one of these signal forming sections is selected by address signals A5*, $\overline{A5*}$, A6* and $\overline{A6*}$ produced from the address buffer. In an active mode, signal fl (l=any one of 1 to 4) from one of the signal forming sections selected is brought to high level, while signals fl from the remaining signal forming sections not selected remain at low level. In a stand-by mode, signals fl (l=1 to 4) are all low and signals $\overline{fl}$ are all high.

The operation of the first embodiment thus constructed will now be described. Since, in a stand-by mode, signal $\overline{l1}$ is high and signal l1 is low, MOSFET 74 is turned ON and MOSFET 78 is turned OFF, thereby causing decode node 76 to become at zero potential. The same thing is true for signals l2 to l4 and $\overline{l2}$ to $\overline{l4}$, with the result that all the decode nodes become at zero potential.

Since, in a stand-by mode, signals f1 to f4 are low, and signals $\overline{f1}$ to $\overline{f4}$ are high, MOSFET 84 is turned OFF and MOSFET 94 is turned ON, causing word line node 86 to become at zero level. The remaining word line nodes are all at zero level, too.

Further, since, in a stand-by mode, signals f1 to f4 of low level are applied to the gates of MOSFETs 124 to 130, MOSFETs 124 to 130 are turned OFF, allowing the potential at decode node 122 to become high. As a result, MOSFET 116 is turned ON, thereby causing a high level voltage to be applied to the gate of MOSFET 114. MOSFET 114 is then turned ON, causing read common node 100 to become at zero level. The same thing is true for the other read common nodes.

Then, the mode of the ROM discussed is switched from a stand-by to active mode by making chip enable signal CE high and $\overline{CE}$ low. Assume that, in an active mode, memory cell transistor 98 is selected. On this assumption, signal l1 is high while signal $\overline{l1}$ is low, causing MOSFET 74 to be turned OFF and MOSFET 78 ON. Address signals A3* or $\overline{A3}$* and A4* or $\overline{A4}$* of low level are applied to the gates of MOSFETs 70 and 72, causing MOSFETs 70 and 72 to be turned OFF. As a result, decode node 76 is brought to high level potential. Then, MOSFET 82 is turned ON, causing Vcc potential to be applied to decode node 76.

Since, in an active mode, signal f1 gets high and signal $\overline{f1}$ gets low, MOSFET 84 is turned ON and MOSFET 94 is turned OFF. Thus, decode node 76 and word line node 86 are electrically connected, thereby allowing a high level voltage to be supplied from decode node 76 to word line node 86. At this time, a capacitive coupling develops between read common node 100 and word line 86 of which the potential is turned high. However, since non-selected word line nodes are all at low level as in a stand-by mode, no coupling between those word line nodes and the read common node develops, thereby causing the capacitive coupling between the word line nodes and the read common node to become extremely smaller than that of the conventional ROM. Accordingly, the switching from a stand-by to active mode little affects the potential at read common node 100. When any one of the other memory transistors is selected, the ROM of the first embodiment operates similarly, allowing capacitive coupling between the word line nodes and the common node to become very small.

Figure 1:
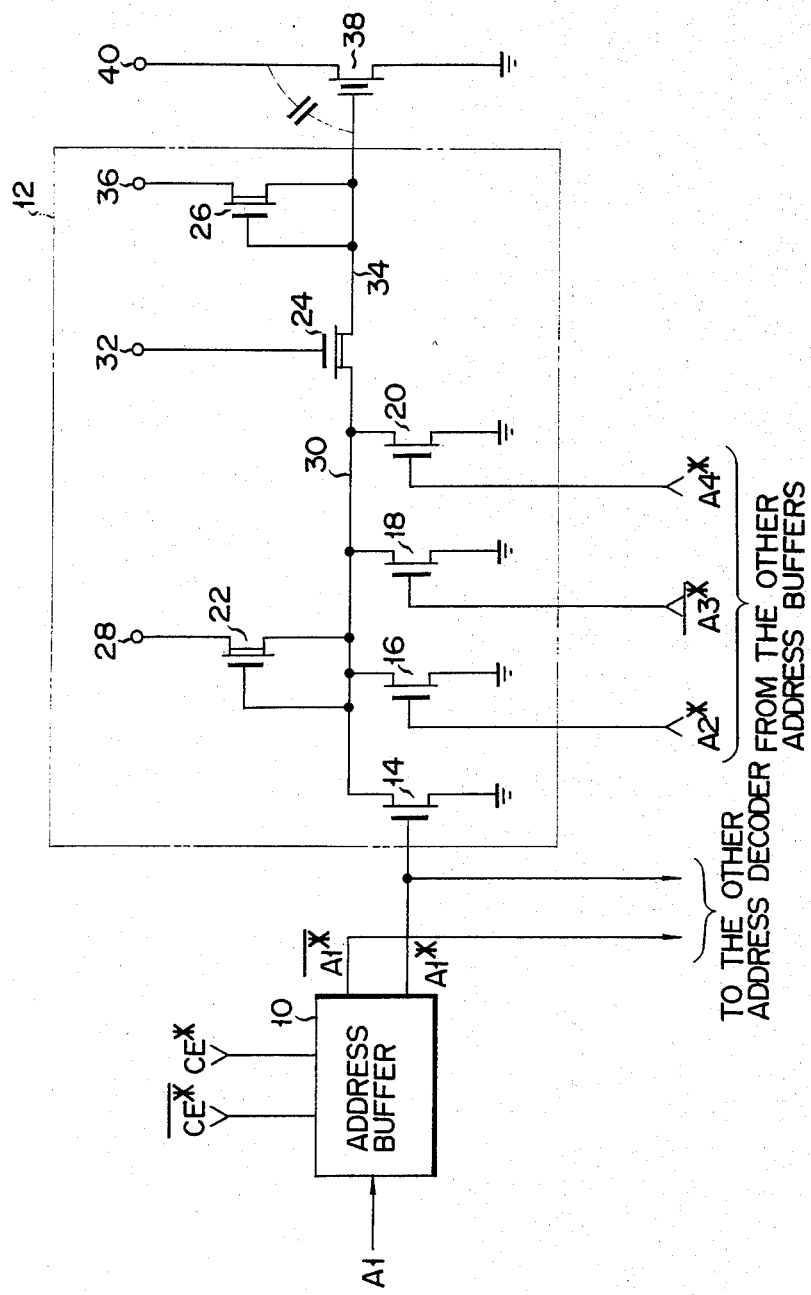
FIG. 1 is a circuit diagram of a major portion of the conventional ROM of the direct decoding system.
Figure 2:
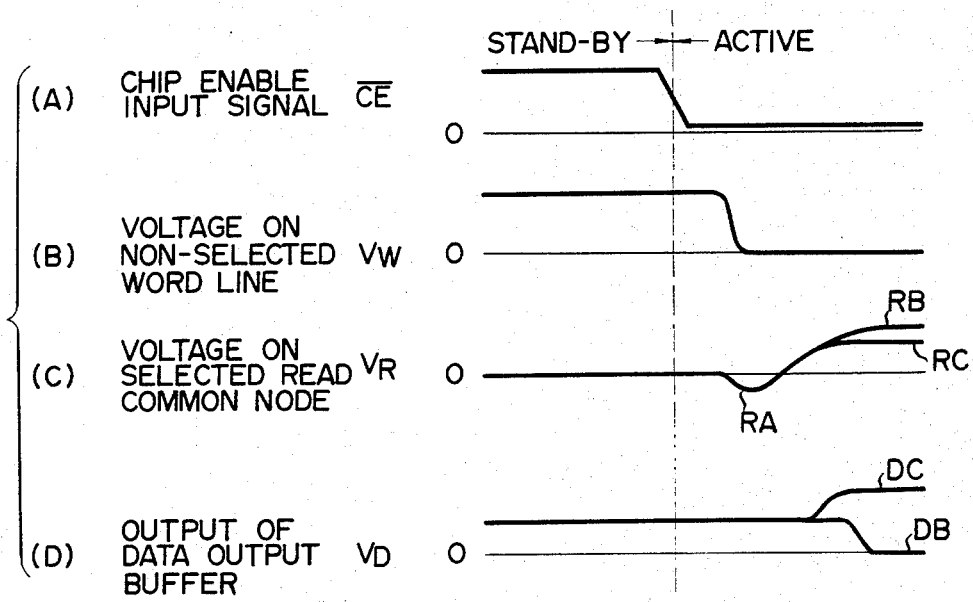
FIGS. 2(A) to 2(D) illustrate waveforms for explaining the operation of the ROM shown in FIG. 1.
Figure 3:
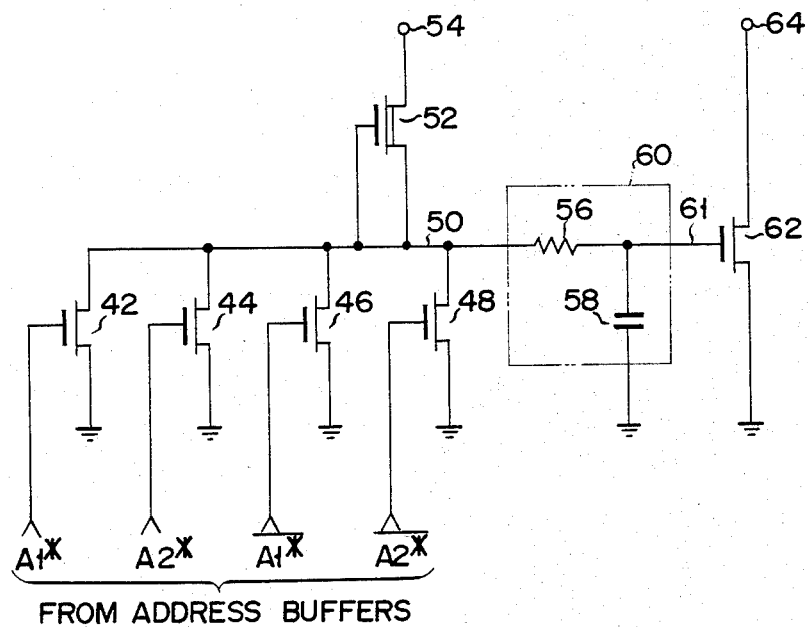
FIG. 3 is a circuit diagram of a major portion of another conventional ROM.
Figure 4:
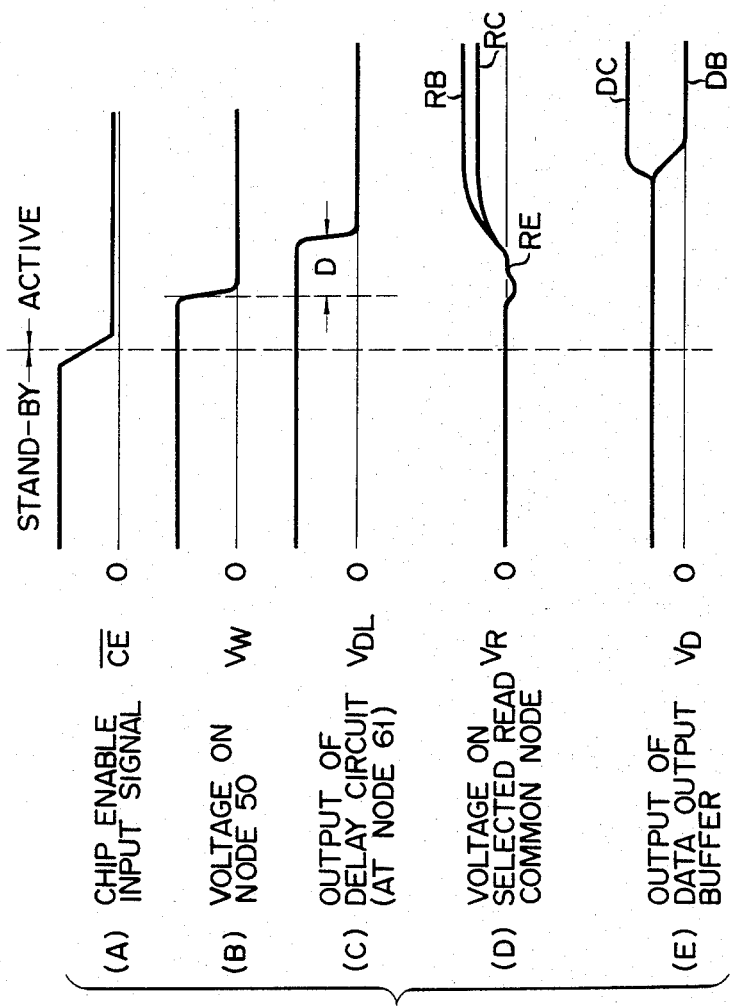
FIGS. 4(A) to 4(E) illustrate waveforms for explaining the operation of the ROM shown in FIG. 3.

As described above, according to the first embodiment, the access time of the ROM by chip enable signals CE and $\overline{CE}$ is independent of the contents ("0" or "1") of the memory cell transistors. In addition to this, since the first embodiment does not use delay circuit 60, which was used in the conventional circuit shown in FIG. 3, there is no delay time D in the first embodiment. Consequently, the first embodiment can realize a semiconductor nonvolatile read only memory device with a high-speed access time.

At present, for the ROM of this type, a scaling process is employed to try to make access time shorter and power consumption lower. This attempt can be carried out successfully by using the first embodiment of the present invention wherein the access time of the ROM from the chip enable buffer, which is as important as the access time from the address buffer, can be improved and the power consumption in a stand-by mode can be reduced. Therefore, the present invention greatly contribute to the improvement of the operating speed of the ROM and less power consumption.

Another important thing in semiconductor read only memory devices, in addition to higher operating speed and less power consumption, is the reliability of nonvolatile memory cell transistors. When word line nodes are at a high level in a stand-by mode, like the conventional device, there is a possibility that data is erroneously stored into nonvolatile memory cell transistors in a stand-by mode. According to the first embodiment, however, since the word line nodes are at ground level in a stand-by mode, such an erroneous data write is prevented, improving the reliability of the ROM.

Further, according to the first embodiment, since, when the operation mode of the memory device is switched from a stand-by to active mode, the read common node is not temporarily pulled to the negative polarity by the capacitive coupling between the word line nodes and the read common node, unlike the conventional device, allowing the potential on the substrate on which the read common node is formed not to be pulled to the negative potential. As a consequence, the substrate potential is stabilized and therefore problems the unstable substrate potential would cause are solved.

Figure 7:
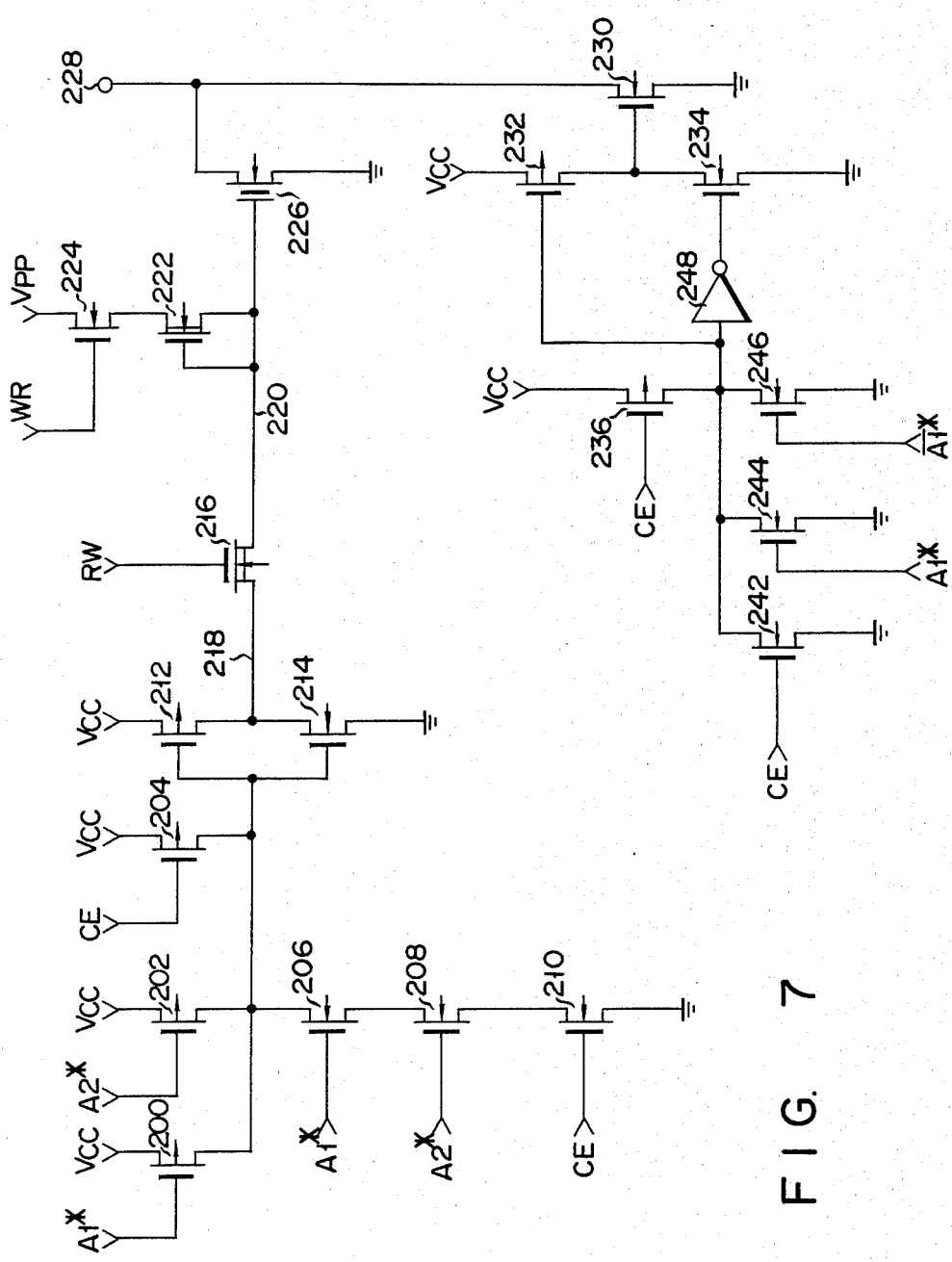
FIG. 7 is a circuit diagram of a major portion of a second embodiment of a ROM using a direct decoding system according to the present invention.

A second embodiment of the present invention will now be described, referring to FIG. 7. The second embodiment is the application of the present invention to a direct decoding type CMOS circuit. FIG. 7 illustrates only a circuit portion related to a memory element. The p-channel MOSFETs 212, 200, 202 and 204, and n-channel E-type MOSFETs 206, 208, 210 and 214, and an n-channel D-type MOSFET 216 constitute a row decoder. The n-channel D-type MOSFET 216 electrically connects a decode node 218 and a word line node 220 in a reading operation and disconnects node 218 from node 220 in a writing operation by a signal RW supplied to the gate. The gate and source of an n-channel D-type MOSFET 222 are connected to word line node 220. Connected to the drain of MOSFET 222 is the source of an n-channel E-type MOSFET 224. When write signal WR is applied to the gate of MOSFET 224, a power source voltage Vpp supplied to the drain is supplied via MOSFET 224 to word line node 220 to charge node 220 up to a write potential. Word line node 220 is connected to the gate of a memory cell transistor 226. Memory cell 226 has the source grounded and the drain connected to a read common node 228.

Read common node 228 is connected to the drain of an n-channel E-type MOSFET 230. MOSFET 230 has the source connected to ground and the gate to the connection point between the drain of p-channel E-type MOSFET 232 and the source of n-channel E-type MOSFET 234. MOSFET 230 is ON in a stand-by mode, keeping read common node 228 at zero potential. A control circuit for controlling MOSFET 230 is constituted of n-channel E-type MOSFETs 242, 244 and 246, p-channel E-type MOSFET 236, and an inverter 248.

With such a construction, since, in a reading operation and a stand-by mode, chip enable signal $\overline{CE}$ is high, MOSFETs 206, 208 and 210 are turned OFF and word line node 220 becomes at zero potential. On the other hand, MOSFETs 242, 244, 246 and 232 are turned OFF and a high level voltage is applied to the gate of MOSFET 230. As a result, MOSFET 230 is turned ON, causing read common node 228 to be at zero potential.

Since, when word line node 220 is selected in an active mode, MOSFETs 206, 208 and 210 are turned ON, while MOSFETs 200, 202 and 204 are turned OFF, word line node 220 becomes at a high level potential. The other word line nodes not selected, however, still remain at low level. Since, in an active mode, MOSFET 242 is turned ON, while the MOSFET 236 is turned OFF, MOSFET 230 becomes OFF. Thus, when a sensed current is supplied from a sense amplifier (not shown) to memory cell transistor 226, stored data is outputted to node 228.

As mentioned above, the second embodiment shown in FIG. 7 can attain effects similar to those of the first embodiment.

The present invention is not limited to the first and second embodiments. For example, the n-channel MOSFETs in the first embodiment may be replaced by p-channel MOSFETs. In this case, the polarity of the voltage applied to the MOSFETs must correspondingly be changed.

It should be understood that the present invention may be modified or changed within the scope of the present invention.

What we claim is:

1. A semiconductor nonvolatile read only memory device comprising:
   semiconductor nonvolatile memory transistors, a reference voltage being applied to the sources of said transistors;
   word lines connected to the gates of said transistors;
   output lines connected to the drains (or sources) of said transistors; and
   voltage applying means connected to said word lines for applying said reference voltage to said word lines in a stand-by mode, and applying a readout voltage to only selected one of said word lines in a readout mode;
   write-in voltage terminal; and
   writing means connected between said write-in voltage terminal and said word lines for applying a write-in voltage to only a selected one of said word lines in a write-in mode and preventing current from flowing from said write-in voltage terminal to said word lines in any operation mode other than a write-in mode.

2. A semiconductor nonvolatile read only memory device according to claim 1, further comprising:
   voltage setting means connected to said output lines for setting said output lines at a specified voltage in a stand-by mode.

3. A semiconductor nonvolatile read only memory device according to claims 1 or 2, wherein said reference voltage is ground potential.

4. A semiconductor nonvolatile read only memory device according to claim 1, wherein said writing means comprises a depletion MOSFET having the gate and the source (or drain) connected to said word line and an enhancement MOSFET having the source (or drain) connected to the drain (or source) of said depletion MOSFET, and the drain (or source) to said write-in terminal, thereby, in a writing operation, allowing a raised voltage higher than a voltage at said write-in terminal to be applied to the gate of said enhancement MOSFET to apply the same voltage as that of said write-in terminal to said word line via said depletion MOSFET, while, in any operation other than writing, permitting a low level voltage to be applied to the same gate to prevent current from being supplied from said write-in terminal through said depletion MOSFET to said word line.

5. A semiconductor nonvolatile read only memory device according to claims 1 or 2, wherein said voltage applying means comprises a pre-decoder including a plurality of MOSFETs, said decoder keeping said word lines at said reference voltage in a stand-by mode, and raising the potential on only one of said word lines selected up to substantially a power source voltage and while keeping said word lines not selected at said reference voltage in an active mode.

6. A semiconductor nonvolatile read only memory device according to claims 1 or 2, wherein said voltage applying means comprises a direct decoder including a plurality of MOSFETs, said direct decoder keeping said word lines at said reference voltage in a stand-by mode, and raising the potential on only one of said word lines selected up to substantially a power source voltage, while keeping said word lines not selected at said reference voltage in an active mode.

7. A semiconductor nonvolatile read only memory device according to claim 2 wherein said voltage setting means comprises a pre-decoder including a plurality of MOSFETs whose drains are connected to said output lines and whose sources are connected to receive said reference voltage, said pre-decoder being so constructed as to turn on said MOSFETS in a stand-by mode, thereby keeping said output lines at said reference voltage, and to turn off said MOSFETs in an active mode, thereby obtaining data stored in said semiconductor nonvolatile memory transistor selected onto said output line.

8. A semiconductor nonvolatile read only memory device according to claim 2 wherein said voltage setting means comprises a direct decoder including a plurality of MOSFETs whose drains are connected to said output lines and whose sources are connected to receive said reference voltage, said direct decoder being so constructed as to turn on said MOSFETs in a stand-by mode, thereby keeping said output lines at said reference voltage, and to turn off said MOSFETs in an active mode, thereby obtaining data stored in said semiconductor nonvolatile memory transistor selected onto said output line.

* * * * *